United States Patent
Tanaka

(10) Patent No.: US 9,682,858 B2
(45) Date of Patent: Jun. 20, 2017

(54) ELECTRONIC DEVICE, PHYSICAL QUANTITY SENSOR, PRESSURE SENSOR, ALTIMETER, ELECTRONIC APPARATUS, AND MOVING OBJECT

(71) Applicant: Seiko Epson Corporation, Tokyo (JP)

(72) Inventor: Nobuyuki Tanaka, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/943,315

(22) Filed: Nov. 17, 2015

(65) Prior Publication Data

US 2016/0137494 A1 May 19, 2016

(30) Foreign Application Priority Data

Nov. 18, 2014 (JP) ................. 2014-233352

(51) Int. Cl.
| | |
|---|---|
| *B81C 1/00* | (2006.01) |
| *H01L 21/762* | (2006.01) |
| *G01L 9/00* | (2006.01) |
| *G01L 5/06* | (2006.01) |

(52) U.S. Cl.
CPC ...... *B81C 1/00801* (2013.01); *B81C 1/00293* (2013.01); *G01L 5/06* (2013.01); *G01L 9/008* (2013.01); *G01L 9/0042* (2013.01); *G01L 9/0045* (2013.01); *G01L 9/0054* (2013.01); *G01L 9/0073* (2013.01); *H01L 21/76264* (2013.01); *H01L 21/76283* (2013.01); *B81C 1/00158* (2013.01); *B81C 2201/014* (2013.01); *B81C 2203/0136* (2013.01)

(58) Field of Classification Search
None
See application file for complete search history.

(56) References Cited

U.S. PATENT DOCUMENTS

| | | | |
|---|---|---|---|
| 7,709,912 B2 | 5/2010 | Sato et al. | |
| 7,880,245 B2 | 2/2011 | Sato et al. | |
| 8,410,561 B2 | 4/2013 | Sato et al. | |
| 8,796,845 B2 * | 8/2014 | Kanemoto | .......... B81C 1/00333 |
| | | | 257/678 |
| 8,912,031 B2 | 12/2014 | Kanemoto et al. | |
| 8,952,467 B2 | 2/2015 | Yoshizawa | |

(Continued)

FOREIGN PATENT DOCUMENTS

| | | |
|---|---|---|
| JP | 2008-114354 A | 5/2008 |
| JP | 2012-096316 A | 5/2012 |

(Continued)

*Primary Examiner* — Ermias Woldegeorgis
(74) *Attorney, Agent, or Firm* — Oliff PLC

(57) ABSTRACT

An physical quantity sensor includes a substrate, a piezoelectric resistive element that is disposed on one surface side of the substrate, a wall portion that is disposed on the one surface side of the substrate so as to surround the piezoelectric resistive element in a plan view of the substrate, and a ceiling portion that is disposed on an opposite side to the substrate with respect to the wall portion and forms a cavity along with the wall portion, in which the wall portion includes an insulating layer, and wiring layers that surround the insulating layer together and have higher resistance to an etchant which can etch the insulating layer than resistance of the insulating layer.

20 Claims, 9 Drawing Sheets

(56) References Cited

U.S. PATENT DOCUMENTS

2007/0013014 A1\* 1/2007 Guo ............... C23C 14/021
 257/417
2014/0157893 A1\* 6/2014 Matsuzawa ............. G01C 5/06
 73/384

FOREIGN PATENT DOCUMENTS

| JP | 2012-119820 A | 6/2012 |
| JP | 2014-086447 A | 5/2014 |

\* cited by examiner

ELECTRONIC DEVICE, PHYSICAL QUANTITY SENSOR, PRESSURE SENSOR, ALTIMETER, ELECTRONIC APPARATUS, AND MOVING OBJECT

CROSS REFERENCE

This application claims benefit of Japanese Application JP 2014-233352, filed on Nov. 18, 2014. The disclosure of the prior application is hereby incorporated by reference herein in its entirety.

BACKGROUND

1. Technical Field

The present invention relates to an electronic device, a physical quantity sensor, a pressure sensor, an altimeter, an electronic apparatus, and a moving object.

2. Related Art

There is an electronic device including a cavity which is formed by using a semiconductor manufacturing process (for example, refer to JP-A-2012-96316). An example of such an electronic device may include an electronic device disclosed in JP-A-2012-96316, and the electronic device includes a substrate, a MEMS structure provided on the substrate, and a coating structure. The coating structure includes a surrounding wall, a first coating layer, and a second coating layer. A cavity in which the MEMS structure is disposed is defined by the surrounding wall, the first coating layer, and the second coating layer.

However, in the electronic device disclosed in JP-A-2012-96316, there is a problem in that, when the cavity is formed by using wet etching, an etchant permeates from a gap with a mask using a resist, thus unexpected etching occurs, and, as a result, airtightness of the cavity is reduced.

SUMMARY

An advantage of some aspects of the invention is to provide an electronic device and a physical quantity sensor with high reliability, and to provide a pressure sensor, an altimeter, an electronic apparatus, and a moving object having the electronic device.

The invention can be implemented as the following application examples.

APPLICATION EXAMPLE 1

An electronic device according to this application example includes a substrate; a functional element that is disposed on one surface side of the substrate; a wall portion that is disposed on the one surface side of the substrate so as to surround the functional element in a plan view of the substrate; and a ceiling portion that is disposed on an opposite side to the substrate with respect to the wall portion and forms an internal space along with the wall portion, in which the wall portion includes an insulating layer, and a plurality of etching resistant layers having higher resistance to an etchant which can etch the insulating layer than resistance of the insulating layer, and in which the plurality of etching resistant layers are coupled to each other and are disposed around the insulating layer in a sectional view in a direction intersecting the substrate.

According to the electronic device, since the plurality of etching resistant layers are coupled to each other and surround the insulating layer, it is possible to prevent the wall portion (especially, the insulating layer) from being etched by an etchant which is used when the internal space is formed. Therefore, it is possible to provide the electronic device having high reliability.

APPLICATION EXAMPLE 2

In the electronic device according to the application example, it is preferable that the plurality of etching resistant layers include a first etching resistant layer, and a second etching resistant layer that is coupled to the first etching resistant layer at two locations and surrounds the insulating layer along with the first etching resistant layer in the sectional view.

With this configuration, the insulating layer can be surrounded by two layers including the first etching resistant layer and the second etching resistant layer.

APPLICATION EXAMPLE 3

In the electronic device according to the application example, it is preferable that the first etching resistant layer includes a fixation portion that is fixed to the substrate; a first flange portion that extends from the fixation portion toward the internal space side and is thus separated from the substrate; and a second flange portion that extends from the fixation portion toward an opposite side to the internal space and is thus separated from the substrate, and the second etching resistant layer includes a first coupling portion that is coupled to the first flange portion; and a second coupling portion that is coupled to the second flange portion.

With this configuration, a step of the wall portion on an opposite side to the substrate can be reduced. For this reason, the adhesiveness between the respective layers forming the wall portion and the ceiling portion can be increased, and thus it is possible to effectively prevent a reduction in the airtightness of the internal space. The adhesiveness with a mask which is used when the internal space is formed through etching can be increased, and, as a result, unexpected etching can be reduced.

APPLICATION EXAMPLE 4

In the electronic device according to the application example, it is preferable that each of the etching resistant layers contains a metal.

The metal can form a film with high accuracy, and also has high resistance to an etchant used to etch the insulating layer which is formed of a silicon oxide film. Therefore, if the etching resistant layers contain the metal, the wall portion can be formed with high accuracy.

APPLICATION EXAMPLE 5

In the electronic device according to the application example, it is preferable that the metal includes aluminum.

Aluminum has a high affinity with a semiconductor manufacturing process among metals. Thus, if the etching resistant layers contain aluminum, the wall portion can be formed relatively easily with high accuracy.

APPLICATION EXAMPLE 6

In the electronic device according to the application example, it is preferable that the insulating layer preferably contains silicon oxide.

Silicon oxide ($SiO_2$) has insulating properties and is suitable as a material of a sacrificial layer. For this reason, it is possible to form the wall portion and the internal space relatively easily with high accuracy.

APPLICATION EXAMPLE 7

In the electronic device according to the application example, it is preferable that the substrate includes a diaphragm that is provided at a position overlapping the ceiling portion in the plan view and undergoes deflection deformation due to received pressure.

With this configuration, it is possible to implement the electronic device (physical quantity sensor) which can detect pressure.

APPLICATION EXAMPLE 8

In the electronic device according to the application example, it is preferable that the functional element is a sensor element which outputs an electric signal due to a strain thereof.

With this configuration, it is possible to improve pressure detection sensitivity.

APPLICATION EXAMPLE 9

A physical quantity sensor according to this application example includes the electronic device according to the application example, in which the functional element is a sensor element disposed on one surface side of the diaphragm.

With this configuration, it is possible to provide the physical quantity sensor having high reliability.

APPLICATION EXAMPLE 10

A pressure sensor according to this application example includes the electronic device according to the application example.

With this configuration, it is possible to provide the pressure sensor having high reliability.

APPLICATION EXAMPLE 11

An altimeter according to this application example includes the electronic device according to the application example.

With this configuration, it is possible to provide the altimeter having high reliability.

APPLICATION EXAMPLE 12

An electronic apparatus according to this application example includes the electronic device according to the application example.

With this configuration, it is possible to provide the electronic apparatus having high reliability.

APPLICATION EXAMPLE 13

A moving object according to this application example includes the electronic device according to the application example.

With this configuration, it is possible to provide the moving object having high reliability.

BRIEF DESCRIPTION OF THE DRAWINGS

The invention will be described with reference to the accompanying drawings, wherein like numbers reference like elements.

FIGS. 3A and 3B are diagrams for explaining an action of the physical quantity sensor illustrated in FIG. 1, in which FIG. 3A is a sectional view illustrating a pressurized state, and FIG. 3B is a plan view illustrating the pressurized state.

DESCRIPTION OF EXEMPLARY EMBODIMENTS

Hereinafter, an electronic device, a physical quantity sensor, a pressure sensor, an altimeter, an electronic apparatus, and a moving object according to an embodiment of the invention will be described in detail on the basis of respective embodiments shown in the accompanying drawings.

1. Physical Quantity Sensor

Figure 1:
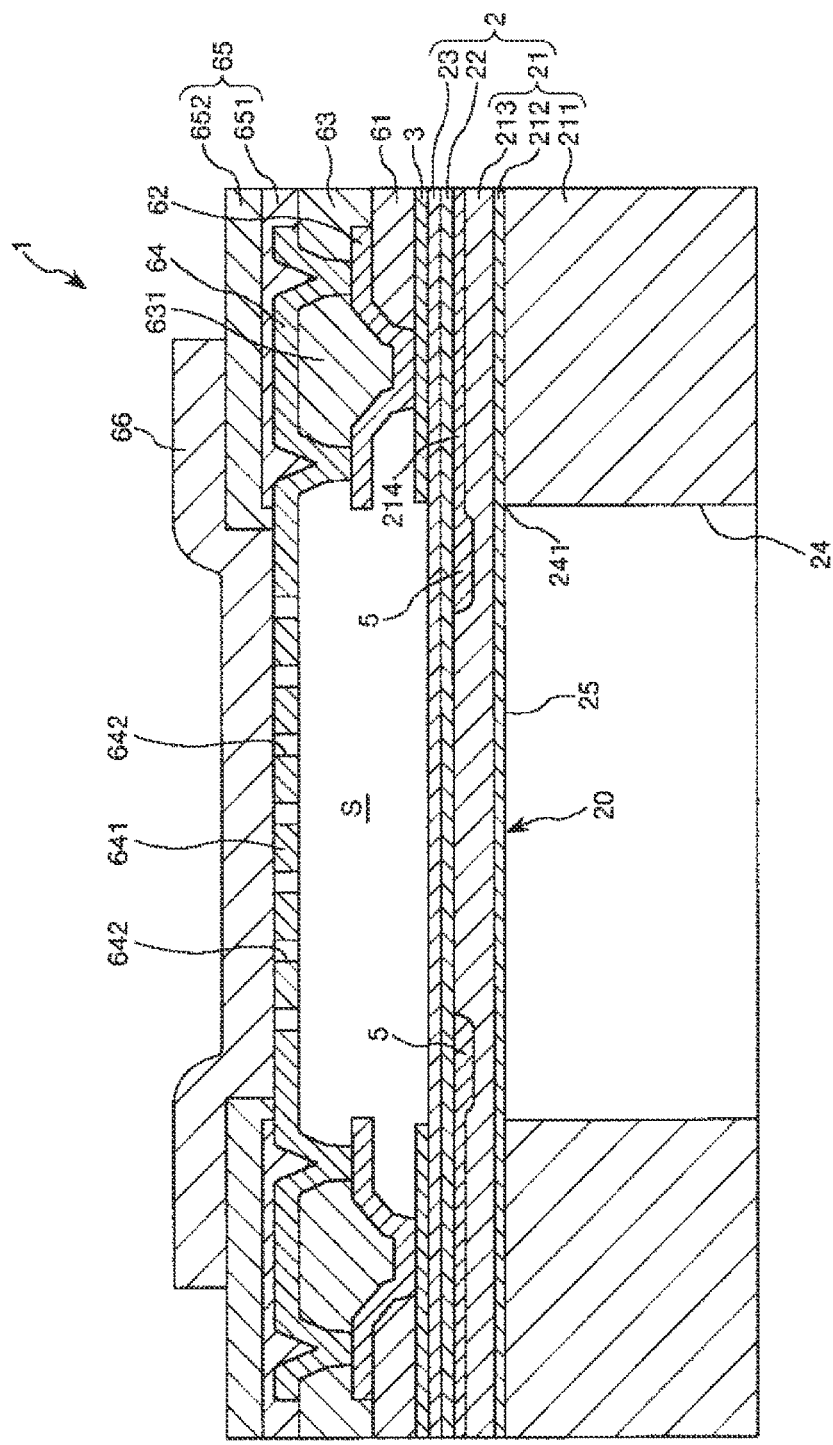
FIG. 1 is a sectional view illustrating a physical quantity sensor (electronic device) according to an embodiment of the invention.
Figure 2:
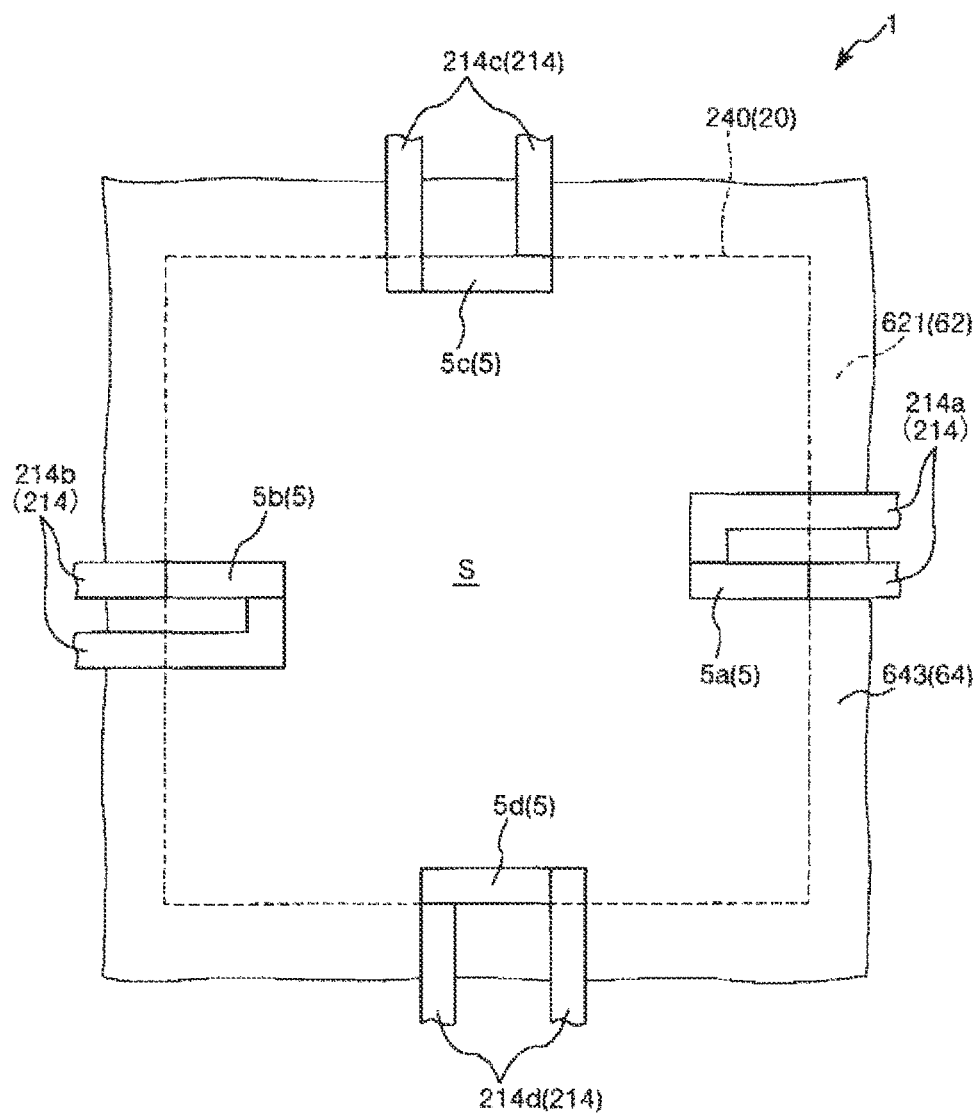
FIG. 2 is a plan view illustrating an arrangement of a piezoelectric resistive element (sensor element) of the physical quantity sensor illustrated in FIG. 1.
Figure 3A:
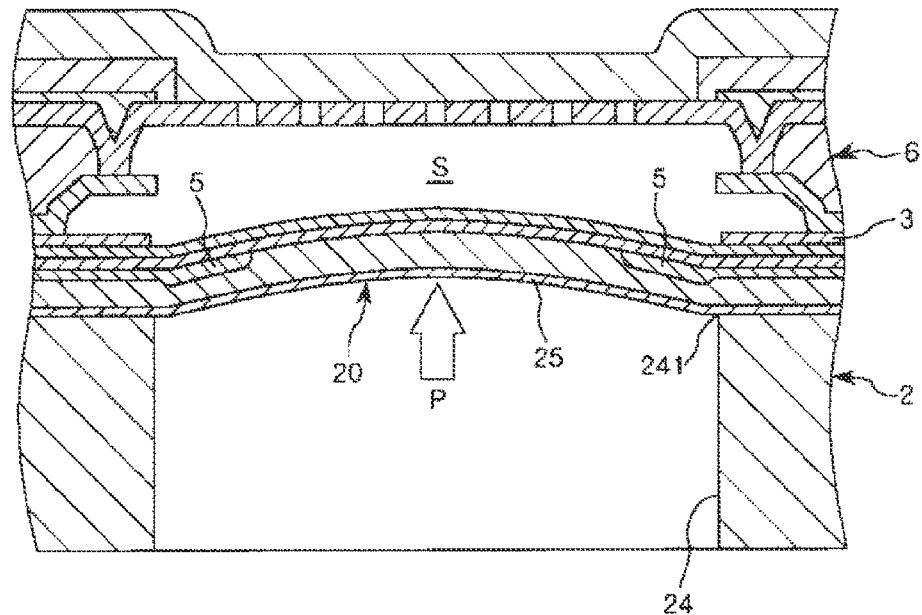
Figure 3B:
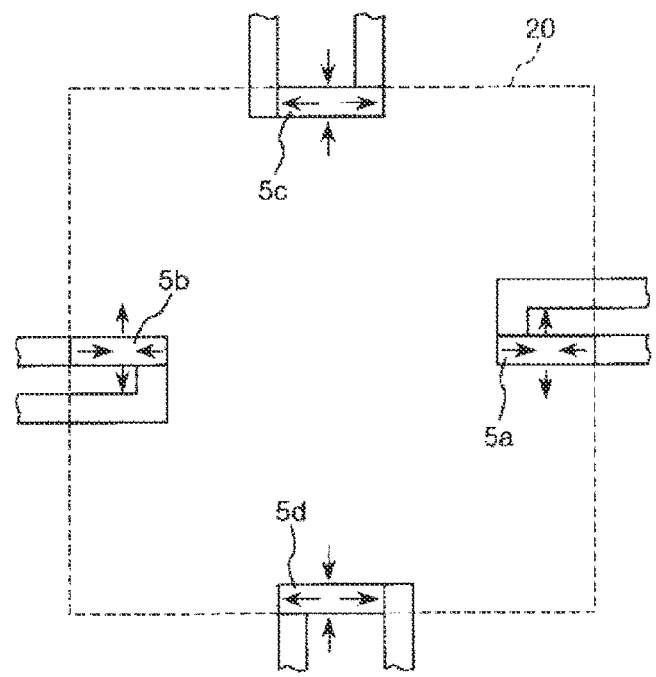

FIG. 1 is a sectional view illustrating a physical quantity sensor according to a first embodiment of the invention, and FIG. 2 is a plan view illustrating an arrangement of a piezoelectric resistive element (sensor element) of the physical quantity sensor illustrated in FIG. 1. FIGS. 3A and 3B are diagrams for explaining an action of the physical quantity sensor illustrated in FIG. 1, in which FIG. 3A is a sectional view illustrating a pressurized state, and FIG. 3B is a plan view illustrating the pressurized state. Hereinafter, for convenience of description, the upper side of FIG. 1 is assumed to be an "upper side", and the lower side thereof is assumed to be a "lower side".

A physical quantity sensor 1 illustrated in FIG. 1 includes a substrate 2 provided with a diaphragm 20, a plurality of piezoelectric resistive elements 5 (sensor element) which are functional elements disposed in the diaphragm 20, a stacked structure 6 which forms a cavity S (internal space) along with the substrate 2, and an intermediate layer 3 disposed between the substrate 2 and the stacked structure 6.

Hereinafter, each constituent element of the physical quantity sensor 1 will be described sequentially.

Substrate

The substrate 2 includes a semiconductor substrate 21, an insulating film 22 provided on one surface of the semiconductor substrate 21, and an insulating film 23 provided on a surface of the semiconductor substrate 21, opposite to the surface on which the insulating film 22 is provided.

The semiconductor substrate 21 is an SOI substrate in which a silicon layer 211 (handle layer) formed of single crystal silicon, a silicon oxide layer 212 (box layer) formed of a silicon oxide film, and a silicon layer 213 (device layer) formed of single crystal silicon are stacked in this order. The semiconductor substrate 21 is not limited to an SOI substrate, and may be, for example, other semiconductor substrates such as a single crystal silicon substrate.

The insulating film 22 is, for example, a silicon oxide film, and has insulating properties. The insulating film 23 is, for example, a silicon nitride film, and has insulating properties and also has resistance to an etchant containing hydrofluoric acid. Here, since the insulating film 22 (silicon oxide film) is interposed between the semiconductor substrate 21 (silicon layer 213) and the insulating film 23 (silicon nitride film), the insulating film 22 can reduce stress which is generated during the formation of the insulating film 23 and is delivered to the semiconductor substrate 21. In a case where semiconductor circuits are formed on and over the semiconductor substrate 21, the insulating film 22 may be used as an inter-element isolation film. The insulating layers 22 and 23 are not limited to the above-described constituent materials, and either one of the insulating layers 22 and 23 may be omitted as necessary.

The patterned intermediate layer 3 is disposed on the insulating film 23 of the substrate 2. The intermediate layer 3 is formed so as to surround the periphery of the diaphragm 20 in a plan view, and thus forms a step difference corresponding to a thickness of the intermediate layer 3 on a central side (inside) of the diaphragm 20 between an upper surface of the intermediate layer 3 and an upper surface of the substrate 2. Consequently, when the diaphragm 20 undergoes deflection deformation due to received pressure, stress can be concentrated on a boundary portion of the diaphragm 20 with the step difference. For this reason, it is possible to improve the detection sensitivity by disposing the piezoelectric resistive element 5 at the boundary portion (or in the vicinity thereof).

The intermediate layer 3 is formed of, for example, single crystal silicon, poly-crystal silicon (polysilicon), or amorphous silicon. The intermediate layer 3 may be formed, for example, by doping (diffusing or implanting) impurities such as phosphor or boron with single crystal silicon, poly-crystal silicon (polysilicon), or amorphous silicon. In this case, since the intermediate layer 3 is conductive, for example, in a case where a MOS transistor is formed on the substrate 2 outside the cavity S, a part of the intermediate layer 3 may be used as a gate electrode of the MOS transistor. A part of the intermediate layer 3 may be used as a wiring.

The diaphragm 20, which is thinner than the peripheral portion and undergoes deflection deformation due to received pressure, is provided in the substrate 2. The diaphragm 20 is formed by providing a bottomed recess 24 on a lower surface of the semiconductor substrate 21. In other words, the diaphragm 20 is configured to include the bottom of the recess 24 which is open to one surface of the substrate 2. A lower surface of the diaphragm 20 is a pressure receiving surface 25. In the present embodiment, as illustrated in FIG. 2, the diaphragm 20 has a square (rectangular) shape in a plan view.

In the substrate 2 of the present embodiment, the recess 24 penetrates through the silicon layer 211, and the diaphragm 20 is formed of four layers including the silicon oxide layer 212, the silicon layer 213, the insulating film 22, and the insulating film 23. Here, the silicon oxide layer 212 can be used as an etching stopper layer when the recess 24 is formed through etching in a manufacturing step of the physical quantity sensor 1 as will be described later, and thus it is possible to reduce a variation in the thickness of the diaphragm 20 for each product.

The recess 24 may not penetrate through the silicon layer 211, and the diaphragm 20 may be formed of five layers including a thin portion of the silicon layer 211, the silicon oxide layer 212, the silicon layer 213, the insulating film 22, and the insulating film 23.

Piezoelectric Resistive Element (Functional Element)

The plurality of piezoelectric resistive elements 5 are formed on the cavity S side of the diaphragm 20 as illustrated in FIG. 1. Here, the piezoelectric resistive elements 5 are formed in the silicon layer 213 of the semiconductor substrate 21.

As illustrated in FIG. 2, the plurality of piezoelectric resistive elements 5 include a plurality of piezoelectric resistive elements 5a, 5b, 5c and 5d which are disposed on an outer circumference of the diaphragm 20.

The piezoelectric resistive element 5a, the piezoelectric resistive element 5b, the piezoelectric resistive element 5c, and the piezoelectric resistive element 5d are disposed so as to respectively correspond to four sides of the diaphragm 20 which is formed in a rectangular shape in a plan view (hereinafter, simply referred to as a "plan view") which is viewed from a thickness direction of the substrate 2.

The piezoelectric resistive element 5a extends in a direction perpendicular to the corresponding side of the diaphragm 20. A pair of wires 214a are electrically connected to both ends of the piezoelectric resistive element a. Similarly, the piezoelectric resistive element 5b extends in a direction perpendicular to the corresponding side of the diaphragm 20. A pair of wires 214b are electrically connected to both ends of the piezoelectric resistive element 5b.

On the other hand, the piezoelectric resistive element 5c extends in a direction parallel to the corresponding side of the diaphragm 20. A pair of wires 214c are electrically connected to both ends of the piezoelectric resistive element 5c. Similarly, the piezoelectric resistive element 5d extends in a direction parallel to the corresponding side of the diaphragm 20. A pair of wires 214d are electrically connected to both ends of the piezoelectric resistive element 5d.

Hereinafter, the wires 214a, 214b, 214c and 214d are referred to as wires 214.

Each of the piezoelectric resistive elements 5 and the wires 214 is formed of silicon (single crystal silicon) which is doped (diffused or injected) with impurities such as phosphor or boron. Here, the doping concentration of the impurities in the wires 214 is higher than the doping concentration of the impurities in the piezoelectric resistive element 5. The wires 214 may be made of metal.

The plurality of piezoelectric resistive elements 5 are configured to have the same resistance value as each other in a natural state, for example.

The above-described piezoelectric resistive elements 5 form a bridge circuit (Wheatstone bridge circuit) via the wires 214 and the like. The bridge circuit is connected to a driving circuit (not illustrated) which supplies a driving voltage. The bridge circuit outputs a signal (voltage) corresponding to the resistance value of the piezoelectric resistive elements 5.

Stacked Structure

The stacked structure 6 is formed so as to define the cavity S along with the above-described substrate 2. Here, the stacked structure 6 is disposed on the piezoelectric resistive element 5 side of the diaphragm 20, and defines (forms) the cavity S (internal space) along with the diaphragm 20 (or the substrate 2).

The stacked structure 6 includes an interlayer insulating film 61 which is formed on the substrate 2 so as to surround the piezoelectric resistive element 5 in a plan view; a wiring layer 62 formed on the interlayer insulating film 61; an interlayer insulating film 63 formed on the wiring layer 62 and the interlayer insulating film 61; a wiring layer 64 including a coating layer 641 which is formed on the interlayer insulating film 63 and has a plurality of fine holes 642 (openings); a surface protection film 65 which is formed on the wiring layer 64 and the interlayer insulating film 63; and a sealing layer 66 provided on the coating layer 641.

Each of the interlayer insulating films 61 and 63 is formed of, for example, a silicon oxide film. Each of the wiring layers 62 and 64 and the sealing layer 66 is made of a metal such as aluminum. The sealing layer 66 seals the fine holes 642 of the coating layer 641. The surface protection film 65 is formed of a $SiO_2$ layer 651 which is a silicon oxide film and a SiN layer 652 which is a silicon nitride film, stacked in this order. Here, the SiN layer 652 mainly has a function of protecting the surface, and the $SiO_2$ layer 651 has a function of increasing the adhesiveness or flatness with the SiN layer 652.

In the stacked structure 6, a structure formed of the wiring layer 62 and the wiring layer 64 excluding the coating layer 641 constitutes a "wall portion" (guard ring) which is disposed so as to surround the piezoelectric resistive element 5 in a plan view on one surface side of the substrate 2. The coating layer 641 constitutes a "ceiling portion" which is disposed on an opposite side to the substrate 2 with respect to the wall portion and forms the cavity S (internal space) along with the wall portion. In addition, the wall portion, and content related thereto will be described later in detail.

The stacked structure 6 may be formed by using the same semiconductor manufacturing process as a CMOS process. In addition, semiconductor circuits may be formed on and over the silicon layer 213. The semiconductor circuit includes active elements such as a MOS transistor, and circuit elements which are formed as necessary, such as a capacitor, an inductor, a resistor, a diode, and a wiring (including the wires connected to the piezoelectric resistive element 5).

The cavity S defined by the substrate 2 and the stacked structure 6 is a closed space. The cavity S functions as a pressure reference chamber which provides a reference value of pressure detected by the physical quantity sensor 1. In the present embodiment, the cavity S is in a vacuum state (300 Pa or less).

Since the cavity S is in a vacuum state, the physical quantity sensor 1 can be used as an "absolute pressure sensor" which detects pressure with the vacuum state as a reference, and thus convenience thereof is improved.

However, the cavity S may not be in a vacuum state, and may be in an atmospheric pressure state, in a depressurized state in which the air pressure is lower than in the atmospheric pressure, or in a pressurized state in which the air pressure is higher than in the atmospheric pressure. The cavity S may be sealed with an inert gas such as a nitrogen gas or a rare gas.

As mentioned above, the configuration of the physical quantity sensor 1 has been described briefly.

In the physical quantity sensor 1 having the configuration, as illustrated in FIG. 3A, the diaphragm 20 is deformed according to a pressure P which is received by the pressure receiving surface 25 of the diaphragm 20, as a result, as illustrated in FIG. 3B, the piezoelectric resistive elements 5a, 5b, 5c and 5d are strained, and thus resistance values of the piezoelectric resistive elements 5a, 5b, 5c and 5d change. Therefore, an output value of the bridge circuit constituted of the piezoelectric resistive elements 5a, 5b, 5c and 5d changes, and the magnitude of the pressure received by the pressure receiving surface 25 can be obtained on the basis of the output value.

More specifically, in a natural state before the deformation of the diaphragm 20 occurs as described above, for example, in a case where the resistance values of the piezoelectric resistive elements 5a, 5b, 5c and 5d are the same as each other, a product of the resistance values of the piezoelectric resistive elements 5a and 5b is the same as a product of the resistance values of the piezoelectric resistive elements 5c and 5d, and an output value (potential difference) of the bridge circuit is zero.

On the other hand, if the diaphragm 20 is deformed as described above, as illustrated in FIG. 3B, compressive strains in a length direction and tensile strains in a width direction occur in the piezoelectric resistive elements 5a and 5b, and tensile strains in a length direction and compressive strains in a width direction occur in the piezoelectric resistive elements 5c and 5d. Therefore, when the diaphragm 20 is deformed as described above, ones of the resistance values of the piezoelectric resistive elements 5a and 5b and the resistance values of the piezoelectric resistive elements 5c and 5d increase, and the others decrease.

There is the occurrence of a difference between the product of the resistance values of the piezoelectric resistive elements 5a and 5b and the product of the resistance values of the piezoelectric resistive elements 5c and 5d due to the strains of the piezoelectric resistive elements 5a, 5b, 5c and 5d, and thus an output value (potential difference) corresponding to the difference is output from the bridge circuit. It is possible to obtain the magnitude (absolute pressure) of the pressure received by the pressure receiving surface 25 on the basis of the output value from the bridge circuit.

Here, since ones of the resistance values of the piezoelectric resistive elements 5a and 5b and the resistance values of the piezoelectric resistive elements 5c and 5d increase, and the others decrease when the diaphragm 20 is deformed as described above, a difference change between the product of the resistance values of the piezoelectric resistive elements 5a and 5b and the product of the resistance values of the piezoelectric resistive elements 5c and 5d can be increased, and thus it is possible to increase an output value from the bridge circuit. As a result, it is possible to increase pressure detection sensitivity.

As mentioned above, in the physical quantity sensor 1, the diaphragm 20 of the substrate 2 is provided at the position overlapping the coating layer 641 in a plan view, and thus undergoes deflection deformation due to received pressure. Consequently, it is possible to implement the physical quantity sensor 1 which can detect a pressure. Since the piezoelectric resistive element 5 disposed in the diaphragm 20 is a sensor element which outputs an electric signal due to a strain thereof, it is possible to improve pressure detection sensitivity. As described above, since the contour of the diaphragm 20 is rectangular in a plan view as described above, it is possible to improve the pressure detection sensitivity.

Wall Portion

Hereinafter, the wall portion will be described in detail.

Figure 4:
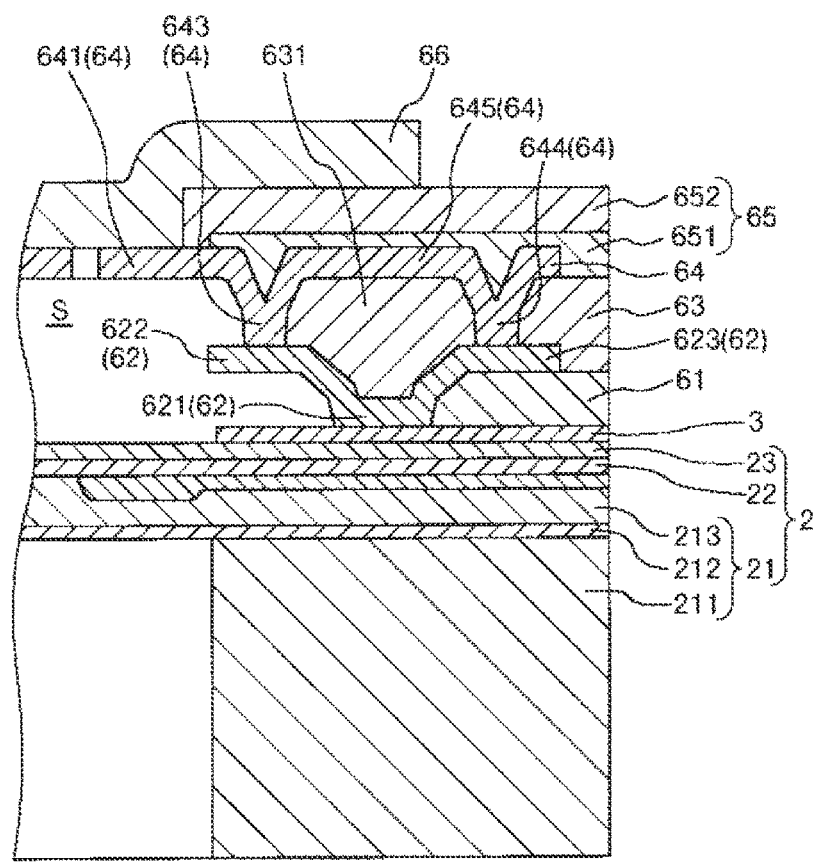
FIG. 4 is a partially enlarged sectional view of the physical quantity sensor illustrated in FIG. 1.

FIG. 4 is a partially enlarged sectional view of the physical quantity sensor illustrated in FIG. 1.

As described above, a structure formed of the wiring layer 62 and the wiring layer 64 excluding the coating layer 641 constitutes the "wall portion" which is disposed so as to surround the piezoelectric resistive element 5 in a plan view on one surface side of the substrate 2, along with an insulating layer 631 which is a part of the interlayer insulating film 63. As illustrated in FIG. 4, the wall portion includes the insulating layer 631, and the wiring layers 62 and 64 which surround the insulating layer 631 together, when viewed from a cross-section which crosses the wall portion.

Here, each of the wiring layers 62 and 64 is an "etching resistant layer" which has higher resistance to an etchant which can etch the insulating layer 631 than that of the insulating layer 631. Since the wiring layers 62 and 64 having the etching resistance surround the insulating layer 631 together, the respective wiring layers 62 and 64 are effectively reinforced by the insulating layer 631. For this reason, cracks are unlikely to be generated in the respective wiring layers 62 and 64, and it is possible to prevent a reduction in the airtightness of the cavity S. Since the plurality of wiring layers 62 and 64 surround the insulating layer 631 together, it is possible to prevent the wall portion (especially, the insulating layer 631) from being etched by an etchant which is used when the cavity S is formed as will be described later. Even if the insulating layer 631 is etched, an outer shape of the wall portion can be stably maintained.

Here, when viewed from the cross-section illustrated in FIG. 4, the wiring layer 64 (second etching resistant layer) is connected to the wiring layer 62 (first etching resistant layer) at two locations, and thus the insulating layer 631 is interposed between the wiring layer 64 and the wiring layer 62. Thus, the insulating layer 631 can be surrounded by two layers including the wiring layer 62 and the wiring layer 64.

More specifically, the wiring layer 62 includes a fixation portion 621 which is fixed to the substrate 2 via the intermediate layer 3; a first flange portion 622 which extends from the fixation portion 621 toward the cavity S side and is thus separated from the substrate 2; and a second flange portion 623 which extends from the fixation portion 621 toward an opposite side to the cavity S and is thus separated from the substrate 2.

On the other hand, the wiring layer 64 includes a first coupling portion 643 which is coupled to the first flange portion 622 of the wiring layer 62; a second coupling portion 644 which is coupled to the second flange portion 623 of the wiring layer 62; and a connecting portion 645 which connects the first coupling portion 643 to the second coupling portion 644 and is separated from the fixation portion 621.

According to the wiring layers 62 and 64 having the above-described configuration, a step of the wall portion on an opposite side to the substrate 2 can be reduced, and thus the flatness can be increased. For this reason, the adhesiveness between the respective layers forming the wall portion and the ceiling portion can be increased, and thus it is possible to effectively prevent a reduction in the airtightness of the cavity S. The adhesiveness with a mask which is used when the cavity S is formed through etching can be increased, and, as a result, unexpected etching can be reduced.

In contrast, assuming that the wiring layer 64 is coupled to the fixation portion 621 of the wiring layer 62, a step difference formed between the coupling portion and other portions of the wiring layer 64 is formed to be large in a superimposed manner due to an influence of a step difference which is formed between the fixation portion 621 of the wiring layer 62 and the first flange portion 622 or the second flange portion 623. As a result, a step difference of the wall portion on the opposite side to the substrate 2 increases, and thus the flatness is reduced. For this reason, for example, in a case where the adhesiveness between the surface protection film 65 and the wiring layer 64 is reduced, and cracks are generated in the wiring layer 64, the airtightness of the cavity S is reduced, or the adhesiveness with a mask used when the cavity S is formed through etching is reduced, and thus unexpected etching occurs. As a result, the airtightness of the cavity S is likely to decrease.

Here, as materials forming the wiring layers 62 and 64, materials having higher resistance to an etchant which can etch the insulating layer 631 than that of the insulating layer 631 may be used, but a metal is preferably used, and aluminum is more preferably used. The metal can form a film with high accuracy, and also has high resistance to an etchant used to etch the insulating layer 631 which is formed of a silicon oxide film. Therefore, if the wiring layers 62 and 64 contain the metal, the wall portion can be formed with high accuracy. Particularly, aluminum has a high affinity with a semiconductor manufacturing process among metals. Thus, if the wiring layers 62 and 64 contain aluminum, the wall portion can be formed relatively easily with high accuracy.

The insulating layer 631 preferably contains silicon oxide ($SiO_2$). Silicon oxide has insulating properties and is suitable as a material of a sacrificial layer. For this reason, it is possible to form the wall portion and the cavity S relatively easily with high accuracy.

A thickness of the wall portion (a distance between the first coupling portion 643 and the second coupling portion 644) is not particularly limited, but is preferably 15 μm or more and 20 μm or less. Consequently, it is possible to reduce a volume occupied by the wall portion and thus to miniaturize the physical quantity sensor 1 while achieving the above-described effects.

Manufacturing Method of Physical Quantity Sensor

Next, a manufacturing method of the physical quantity sensor 1 will be described briefly.

FIGS. 5A to 7C are diagrams illustrating manufacturing steps of the physical quantity sensor illustrated in FIG. 1. Hereinafter, the manufacturing of the physical quantity sensor 1 will be described on the basis of the drawings.

Element Formation Step

Figure 5A:
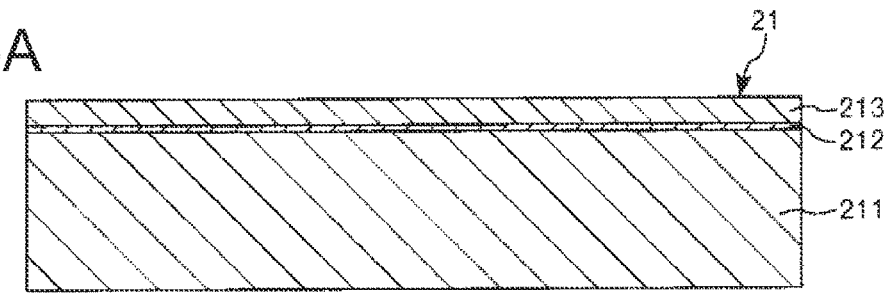
FIGS. 5A to 5D are diagrams illustrating manufacturing steps of the physical quantity sensor illustrated in FIG. 1.

First, as illustrated in FIG. 5A, the semiconductor substrate 21 which is an SOI substrate is prepared.

Figure 5B:
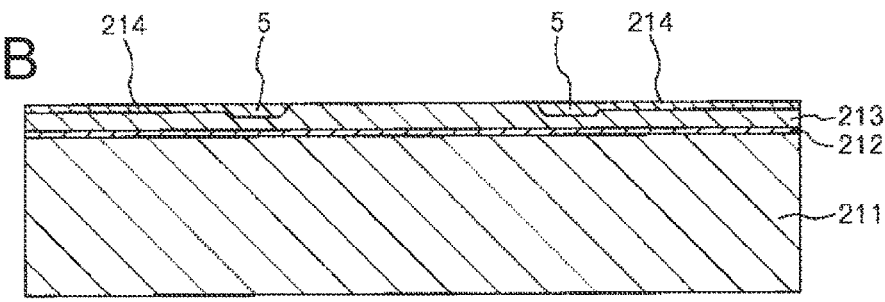

The silicon layer 213 of the semiconductor substrate 21 is doped with (implanted with ions) impurities such as phosphor (n-type) or boron (p-type), and thus a plurality of piezoelectric resistive elements 5 and wires 214 are formed as illustrated in FIG. 5B.

For example, in a case where boron ion implantation is performed at +80 keV, the concentration of ions to be implanted into the piezoelectric resistive elements 5 is set to about $1\times10^{14}$ atoms/cm$^2$. The concentration of ions to be implanted into the wires 214 is higher than that into the piezoelectric resistive elements 5. For example, in a case where boron ion implantation is performed at 10 keV, the concentration of ions to be implanted into the wires 214 is set to about $5\times10^{15}$ atoms/cm$^2$. After the above-described ion implantation is performed, for example, annealing is performed for twenty minutes at about 1000° C.

Formation Step of Insulating Film and the Like

Figure 5C:
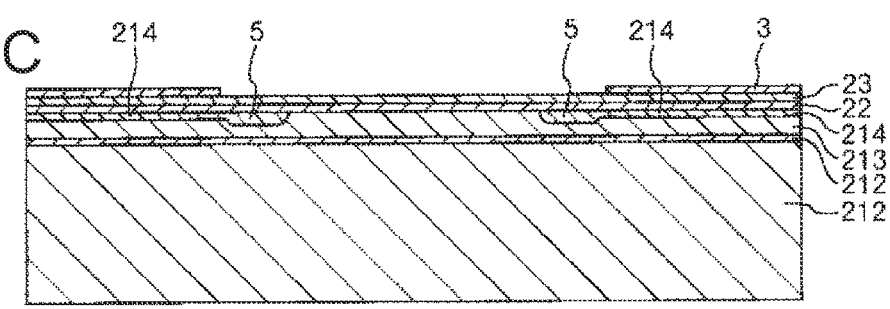

Next, as illustrated in FIG. 5C, the insulating film 22, the insulating film 23, and the intermediate layer 3 are formed in this order on the silicon layer 213.

The insulating films 22 and 23 may be formed by using, for example, a sputtering method and a CVD method. The intermediate layer 3 may be formed by forming a film of polysilicon according to the sputtering method or the CVD method, by doping (performing ion implantation on) the film with impurities such as phosphor or boron as necessary, and then by patterning the film through etching.

Formation Step of Interlayer Insulating Film and Wiring Layer

Figure 5D:
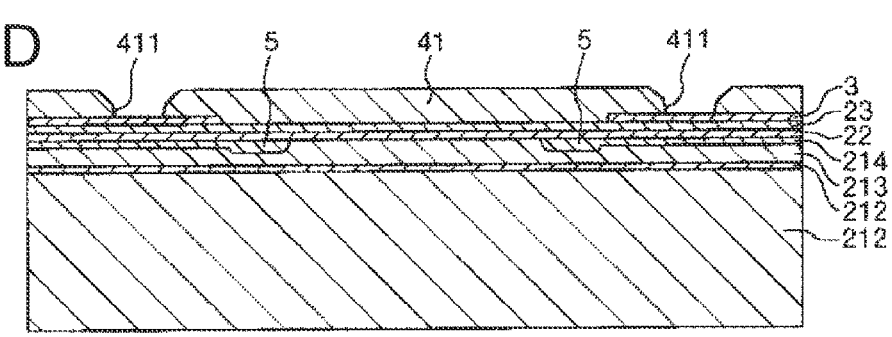

Next, as illustrated in FIG. 5D, a sacrificial layer 41 is formed on the insulating film 23.

The sacrificial layer 41 is partially removed in a cavity formation step which will be described later, and the remaining sacrificial layer 41 becomes the interlayer insulating film 61 and has through holes 411 through which the wiring layer 62 penetrates. The sacrificial layer 41 is formed by forming a silicon oxide film according to a sputtering method, a CVD method, or the like, and by patterning the silicon oxide film through etching.

A thickness of the sacrificial layer 41 is not particularly limited, but is, for example, about 1500 nm or more and 5000 nm or less.

Figure 6A:
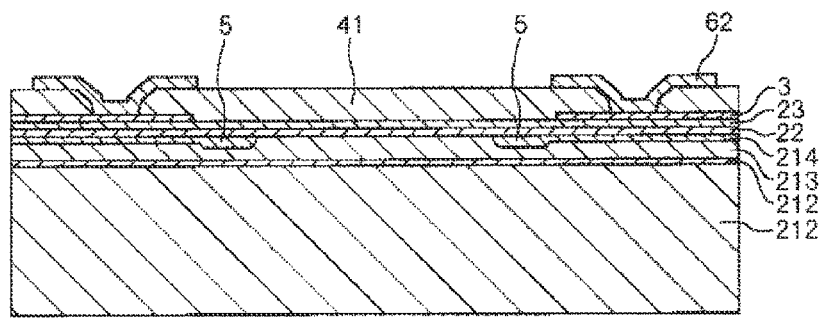
FIGS. 6A to 6D are diagrams illustrating manufacturing steps of the physical quantity sensor illustrated in FIG. 1.

Next, as illustrated in FIG. 6A, the wiring layer 62 is formed so as to bury the through holes 411 formed in the sacrificial layer 41.

The wiring layer 62 may be formed by forming, for example, a uniform conductive film according to, for example, a sputtering method or a CVD method, and by patterning the conductive film. Although not illustrated, in a case where the wiring layer 62 is formed by using aluminum, for example, a glue layer formed of a Ti layer and a TiN layer may be formed on wall surfaces of the through hole 411 prior to formation of an aluminum film. After the aluminum film is uniformly formed, for example, an antireflection layer formed of a TiN layer may be formed on the film.

A thickness of the wiring layer 62 is not particularly limited, but is, for example, about 300 nm or more and 900 nm or less.

Figure 6B:
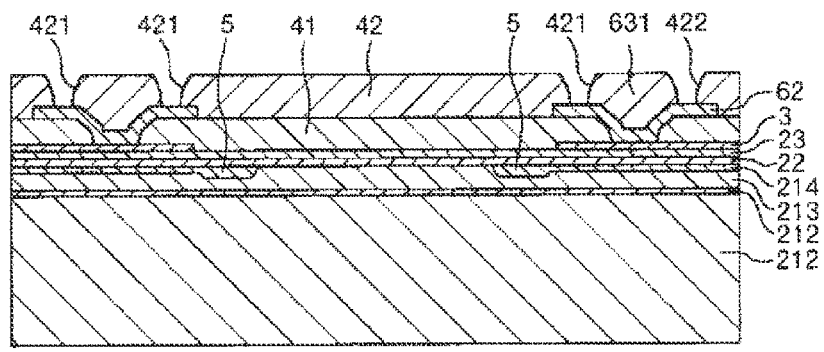

Next, as illustrated in FIG. 6B, the sacrificial layer 42 is formed on the sacrificial layer 41 and the wiring layer 62.

The sacrificial layer 42 is partially removed in the cavity formation step which will be described later, and the remaining sacrificial layer 42 becomes the interlayer insulating film 63 and has through holes 421 and 422 through which the wiring layer 64 penetrates. In the same manner as in the formation of the sacrificial layer 41, the sacrificial layer 42 is formed by forming a silicon oxide film according to a sputtering method, a CVD method, or the like, and by patterning the silicon oxide film through etching.

A thickness of the sacrificial layer 42 is not particularly limited, but is, for example, about 1500 nm or more and 5000 nm or less.

Figure 6C:
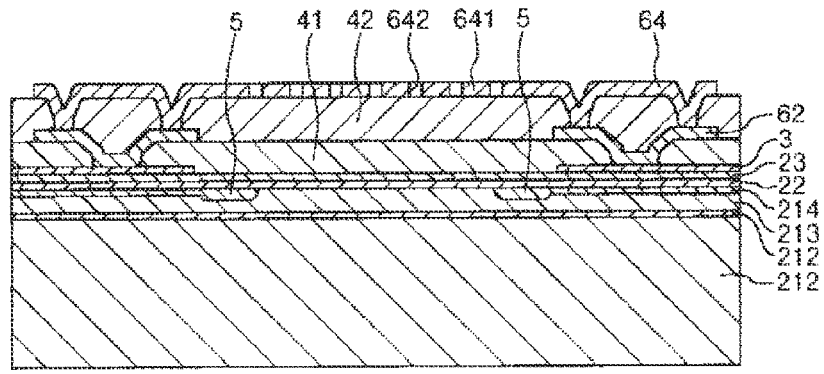

Next, as illustrated in FIG. 6C, the wiring layer 64 is formed so as to bury the through holes 421 and 422 formed in the sacrificial layer 42. Consequently, a part of the sacrificial layer 42 is surrounded by the wiring layers 62 and 64, and thus the insulating layer 631 is formed.

The wiring layer 64 may be formed by forming, for example, a uniform conductive film according to, for example, a sputtering method or a CVD method, and by patterning the conductive film. Although not illustrated, in a case where the wiring layer 64 is formed by using aluminum, for example, a glue layer formed of a Ti layer and a TiN layer may be formed on wall surfaces of the through holes 421 and 422 prior to formation of an aluminum film. After the aluminum film is uniformly formed, for example, an antireflection layer formed of a TiN layer may be formed on the film.

A thickness of the wiring layer 64 is not particularly limited, but is, for example, about 300 nm or more and 900 nm or less.

In the above-described way, the sacrificial layers 41 and 42 and the wiring layers 62 and 64 are formed. The stacked structure constituted of the sacrificial layers 41 and 42 and the wiring layers 62 and 64 is formed by using a typical CMOS process, and the number of stacked layers is appropriately set as necessary. In other words, more sacrificial layers or wiring layers may be stacked as necessary.

Figure 6D:
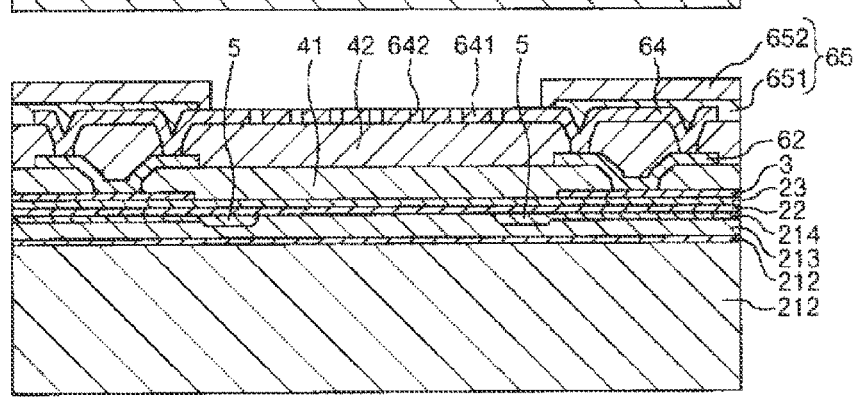

Next, as illustrated in FIG. 6D, the surface protection film 65 is formed according to a sputtering method, a CVD method, or the like. Consequently, the portions of the sacrificial layers 41 and 42 which will become the interlayer insulating films 61 and 63 can be protected during the etching in the cavity formation step which will be described later.

Here, when the surface protection film 65 including the above-described $SiO_2$ layer 651 and SiN layer 652 is formed, a $SiO_2$ layer and a SiN layer are uniformly formed in this order and are then patterned, so that the $SiO_2$ layer 651 and the SiN layer 652 are formed.

A configuration of the surface protection film 65 is not limited to the above-described configuration. A material forming the surface protection film 65 may include a film having resistance for protecting the element from moisture, dust, or scratch, such as a silicon oxide film, a silicon nitride film, a polyimide film, and an epoxy resin film, and, particularly, the silicon nitride film is preferably used.

A thickness of the surface protection film 65 is not particularly limited, but is, for example, about 500 nm or more and 2000 nm or less.

Cavity Formation Step

Figure 7A:
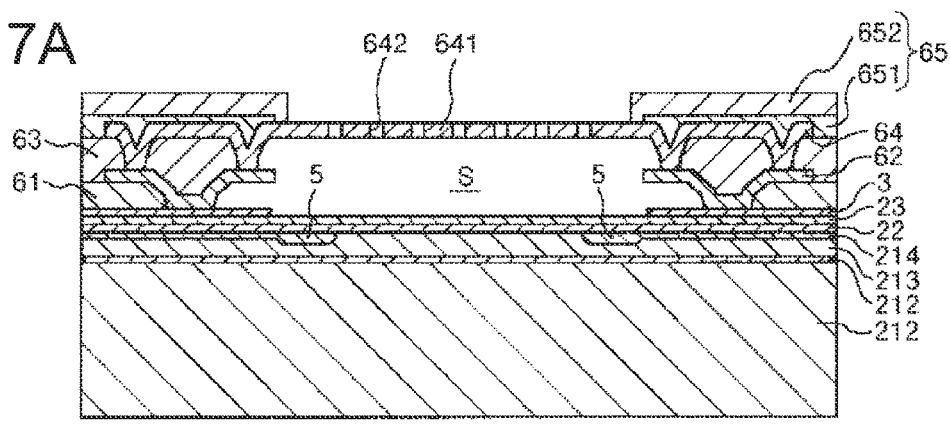
FIGS. 7A to 7C are diagrams illustrating manufacturing steps of the physical quantity sensor illustrated in FIG. 1.

Next, the sacrificial layers 41 and 42 are partially removed, and thus the cavity S is formed between the insulating film 23 and the coating layer 641 as illustrated in FIG. 7A. Therefore, the interlayer insulating films 61 and 63 are formed.

The cavity S is formed by partially removing the sacrificial layers 41 and 42 through etching using a plurality of fine holes 642 formed in the coating layer 641. Here, in a case where wet etching is used as such etching, an etchant such as hydrofluoric acid or buffer hydrofluoric acid is supplied from the plurality of fine holes 642, and, in a case where dry etching is used, an etching gas such as a hydrofluoric acid gas is supplied from the plurality of fine holes 642. The insulating film 23 functions as an etching stopper layer during the etching. The insulating film 23 has resistance to the etchant and thus also has a function of protecting the underlying constituent portions (for example, the insulating film 22, the piezoelectric resistive elements 5, and the wires 214) of the insulating film 23 from the etchant.

Sealing Step

Figure 7B:
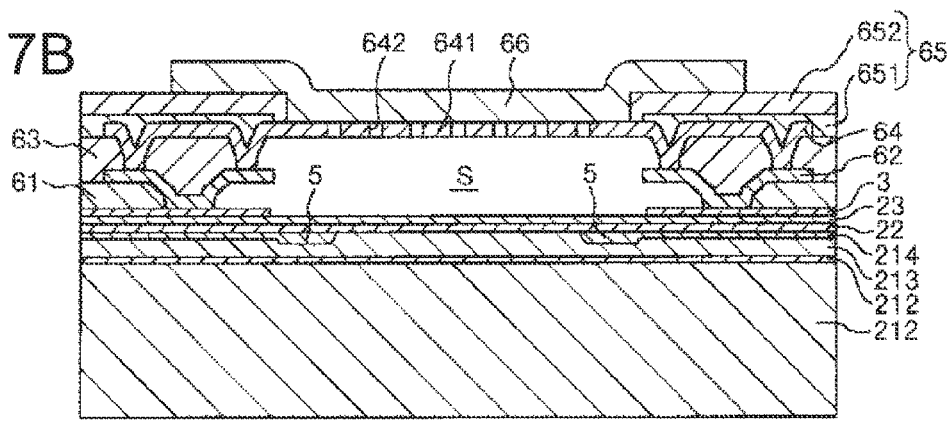

Next, as illustrated in FIG. 7B, the sealing layer 66 formed of a silicon oxide film, a silicon nitride film, or a metal film such as Al, Cu, W, Ti, or TiN is formed on the coating layer 641 according to a sputtering method, a CVD method, or the like, so as to seal the fine holes 642. Consequently, the cavity S is sealed with the sealing layer 66, and thus the stacked structure 6 is obtained.

Here, a thickness of the sealing layer 66 is not particularly limited, but is, for example, about 1000 nm or more and 5000 nm or less.

Diaphragm Formation Step

Figure 7C:
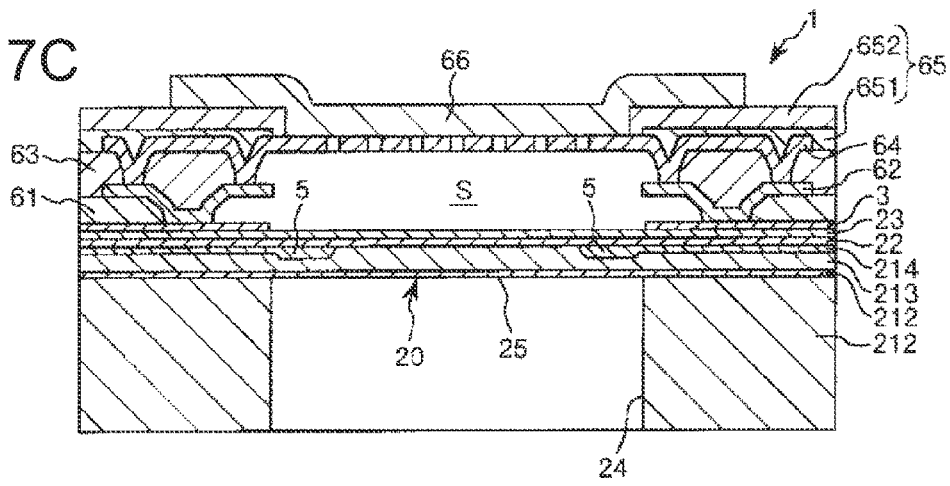

Next, a part of a lower surface of the silicon layer 211 is removed (processed) through etching after grinding the lower surface of the silicon layer 211 as necessary, and thus the recess 24 is formed as illustrated in FIG. 7C. Consequently, the diaphragm 20 which opposes the coating layer 641 via the cavity S is formed.

Here, when the part of the lower surface of the silicon layer 211 is removed, the silicon oxide layer 212 functions as an etching stopper layer. Consequently, a thickness of the diaphragm 20 can be specified with high accuracy.

As a method of removing the part of the lower surface of the silicon layer 211, dry etching, wet etching, and the like may be employed.

The physical quantity sensor 1 can be manufactured through the above-described steps.

2. Pressure Sensor

Figure 8:
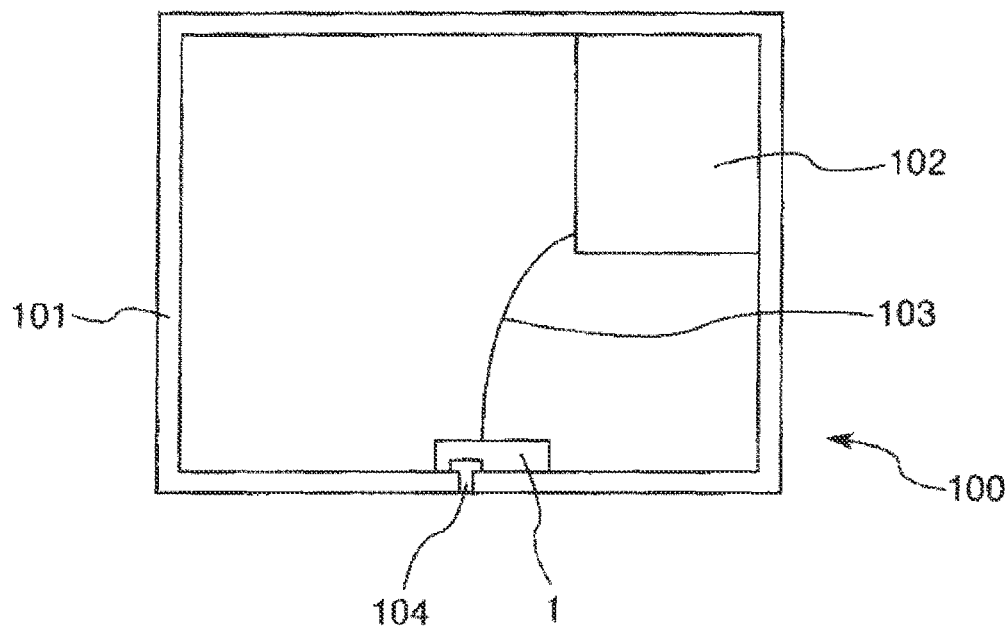
FIG. 8 is a sectional view illustrating an example of a pressure sensor according to an embodiment of the invention.

Next, a pressure sensor (a pressure sensor according to an embodiment of the invention) including the physical quantity sensor according to an embodiment of the invention will be described. FIG. 8 is a sectional view illustrating an example of a pressure sensor according to an embodiment of the invention.

As illustrated in FIG. 8, a pressure sensor 100 according to an embodiment of the invention includes the physical quantity sensor 1, a casing 101 which stores the physical quantity sensor 1, and a calculation unit 102 which converts a signal obtained from the physical quantity sensor 1 into pressure data. The physical quantity sensor 1 is electrically connected to the calculation unit 102 via a wire 103.

The physical quantity sensor 1 is fixed inside the casing 101 via a fixation mechanism (not illustrated). The casing 101 is provided with a through hole 104 via which the diaphragm 20 of the physical quantity sensor 1 communicates with, for example, the atmosphere (the outside of the casing 101).

According to the pressure sensor 100, the diaphragm 20 receives pressure via the through hole 104. A signal corresponding to the received pressure is transmitted to the calculation unit 102 via the wire 103, and is converted into pressure data. The calculated pressure data may be displayed on a display unit (not illustrated) (for example, a monitor of a personal computer).

3. Altimeter

Figure 9:
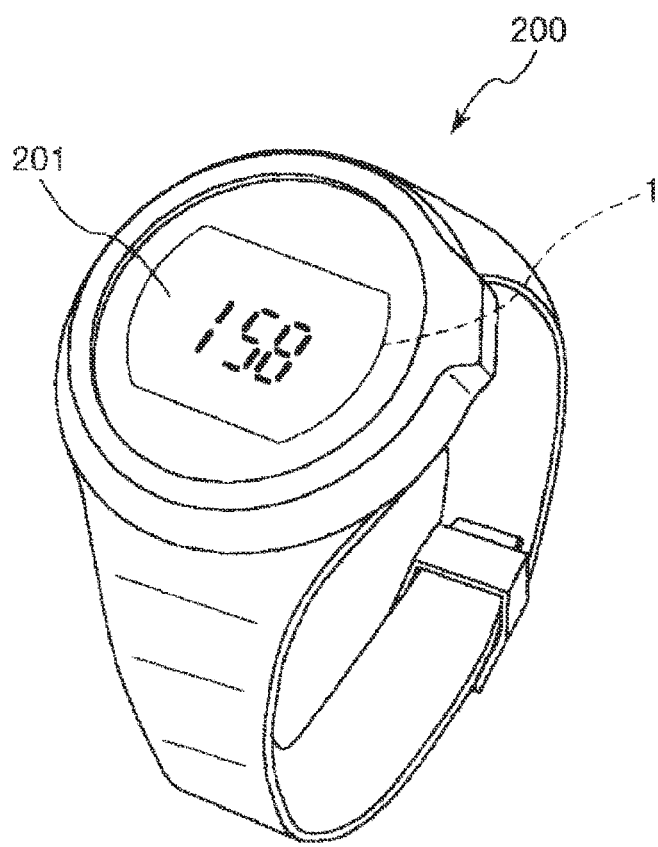
FIG. 9 is a perspective view illustrating an example of an altimeter according to an embodiment of the invention.

Next, a description will be made of an example of an altimeter including the physical quantity sensor according to an embodiment of the invention. FIG. 9 is a perspective view illustrating an example of an altimeter according to an embodiment of the invention.

An altimeter 200 may be mounted on the wrist like a wristwatch. The physical quantity sensor 1 (the pressure sensor 100) is mounted in the altimeter 200, and thus an altitude of the present location above the sea level, the atmospheric pressure of the present location, or the like can be displayed on a display unit 201.

Various pieces of information such as the present time, a user's heart rate, and weather may be displayed on the display unit 201.

4. Electronic Apparatus

Figure 10:
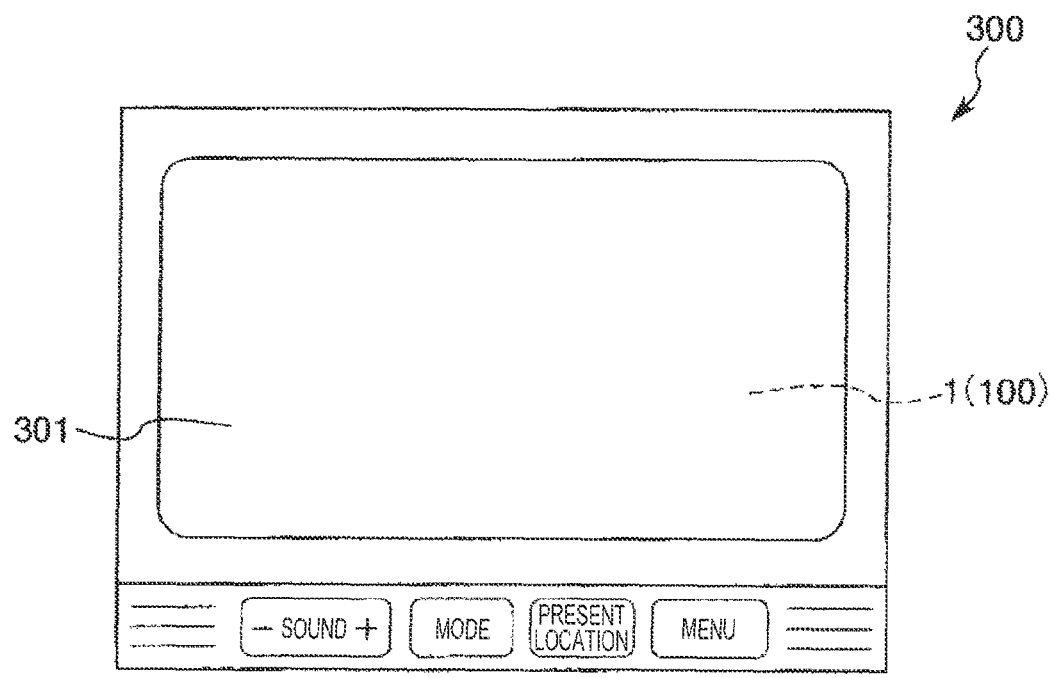
FIG. 10 is a front view illustrating an example of an electronic apparatus according to an embodiment of the invention.

Next, a description will be made of a navigation system to which an electronic apparatus including the physical quantity sensor according to an embodiment of the invention is applied. FIG. 10 is a front view illustrating an example of an electronic apparatus according to an embodiment of the invention.

A navigation system 300 includes a position information acquisition unit that acquires position information on the basis of map information and a global positioning system (GPS) (not illustrated); a self-contained navigation unit which includes a gyro sensor and an acceleration sensor and performs navigation based on vehicle velocity data; the physical quantity sensor 1; and a display unit 301 which displays predetermined position information or course information.

According to the navigation system, it is possible to acquire altitude information in addition to the obtained position information. Since the altitude information is acquired, for example, in a case where a vehicle travels along an elevated road which has the substantially same position as that of a general road in terms of position information, the navigation system cannot determine whether the vehicle travels along the general road or the elevated road unless the altitude information is acquired, and provides information regarding the general road to a user as priority information. Therefore, the navigation system 300 according to the present embodiment can acquire altitude information by using the physical quantity sensor 1, can detect an altitude change due to entrance to an elevated road from a general road, and can provide navigation information in a traveling state on the elevated road to a user.

The display unit 301 has a configuration capable of achieving a small size and being thinned, such as a liquid crystal panel display or an organic electroluminescent (EL) display.

An electronic apparatus including the physical quantity sensor according to the embodiment of the invention is not limited thereto, and may be applied, for example, to a personal computer, a mobile phone, a medical apparatus (for example, an electronic thermometer, a sphygmomanometer, a blood glucose monitoring system, an electrocardiographic apparatus, an ultrasonic diagnostic apparatus, or an electronic endoscope), various measurement apparatuses, meters and gauges (for example, meters and gauges of vehicles, aircrafts, and ships), and a flight simulator.

5. Moving Object

Figure 11:
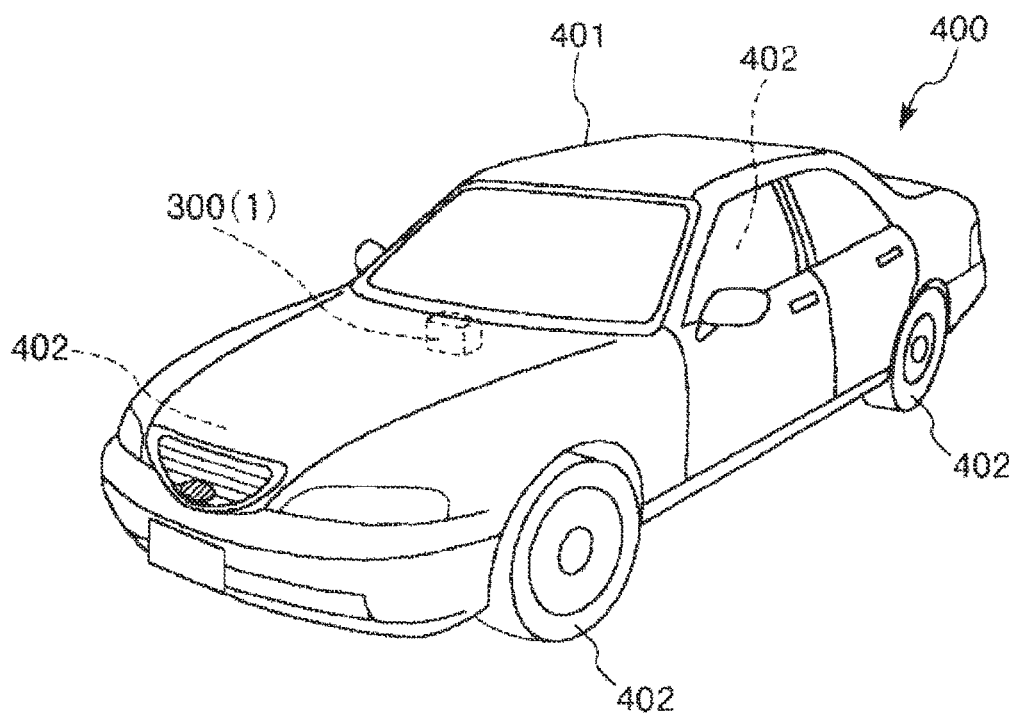
FIG. 11 is a perspective view illustrating an example of a moving object according to an embodiment of the invention.

Next, a description will be made of a moving object (a moving object according to an embodiment of the invention) to which the physical quantity sensor according to the embodiment of the invention is applied. FIG. 11 is a perspective view illustrating an example of a moving object according to an embodiment of the invention.

As illustrated in FIG. 11, a moving object 400 includes a car body 401 and four wheels 402, and the wheels 402 are rotated by a power source (engine) which is not shown in a figure provided in the car body 401. The navigation system 300 (the physical quantity sensor 1) is built into the moving object 400.

As mentioned above, the electronic device, the physical quantity sensor, the pressure sensor, the altimeter, the electronic apparatus, and the moving object according to the embodiments of the invention have been described with reference to the drawings, but the invention is not limited thereto, and a configuration of each part according to the embodiment of the invention may be replaced with any configuration having the same function as in the above-described embodiments. Any configuration may be added thereto.

Regarding the number of piezoelectric resistive elements (functional elements) provided in a single diaphragm, a case where the number thereof is four has been described as an example in the above embodiment, but the number of piezoelectric resistive elements may be one or more and three or less, or five or more. An arrangement or a shape of the piezoelectric resistive element is not limited to that in the above-described embodiment, and, for example, in the above-described embodiment, the piezoelectric resistive element may be disposed at a center of the diaphragm.

In the above embodiment, a description has been made of an example of a case where the piezoelectric resistive element is used as a sensor element detecting deflection of the diaphragm, but a sensor element is not limited thereto and may be, for example, a resonator.

In the above embodiment, a description has been made of an example of a case where the electronic device according to the embodiment of the invention is applied to the physical quantity sensor, but the invention is not limited thereto. As described above, the invention is applicable to various electronic devices in which a wall portion and a ceiling portion are formed on the substrate by using a semiconductor manufacturing process, and an internal space is formed by the substrate, the wall portion and the ceiling portion. In this case, a diaphragm may be omitted.

In the above-described embodiment, a case where the number of etching resistant layers of the wall portion is two has been described as an example, but the number of etching resistant layers is not limited thereto and may be three or more. In this case, two certain etching resistant layers which are adjacent to each other among the three or more etching resistant layers may surround the insulating layer, or three or more etching resistant layers may surround the insulating layer. However, from the viewpoint of reducing a step difference of the wall portion on the opposite side to the substrate, the insulating layer is preferably surrounded by a plurality of etching resistant layers including an etching resistant layer which is closest to the ceiling portion side.

What is claimed is:

1. An electronic device comprising:
a substrate;
a functional element that is disposed in a surface side of the substrate;
a wall portion that is disposed on the one surface side of the substrate so as to surround the functional element in a plan view of the substrate; and
a ceiling portion that is disposed on an opposite side to the substrate with respect to the wall portion and forms an internal space along with the wall portion,
wherein the wall portion includes an insulating layer, and a plurality of etching resistant layers having higher resistance to an etchant than the insulating layer,
wherein the plurality of etching resistant layers are coupled to each other and are disposed around the insulating layer in a sectional view in a direction intersecting the substrate, and
wherein the plurality of etching resistant layers include a first etching resistant layer that includes
a fixation portion that is fixed to the substrate,
a first flange portion that extends from the fixation portion toward the internal space side and is thus separated from the substrate, and
a second flange portion that extends from the fixation portion toward an opposite side to the internal space and is thus separated from the substrate.

2. The electronic device according to claim 1,
wherein the plurality of etching resistant layers includes a second etching resistant layer that is coupled to the first etching resistant layer at two locations and surrounds the insulating layer along with the first etching resistant layer in the sectional view.

3. The electronic device according to claim 2,
wherein the second etching resistant layer includes
a first coupling portion that is coupled to the first flange portion; and
a second coupling portion that is coupled to the second flange portion.

4. A pressure sensor comprising the electronic device according to claim 3.

5. An altimeter comprising the electronic device according to claim 3.

6. An electronic apparatus comprising the electronic device according to claim 3.

7. A pressure sensor comprising the electronic device according to claim 2.

8. An altimeter comprising the electronic device according to claim 2.

9. An electronic apparatus comprising the electronic device according to claim 2.

10. A moving object comprising the electronic device according to claim 2.

11. The electronic device according to claim 1,
wherein each of the etching resistant layers contains a metal.

12. The electronic device according to claim 11,
wherein the metal includes aluminum.

13. The electronic device according to claim 1,
wherein the insulating layer contains silicon oxide.

14. The electronic device according to claim 1,
wherein the substrate includes a diaphragm that is provided at a position which overlaps the ceiling portion in the plan view and that undergoes deflection deformation due to received pressure.

15. The electronic device according to claim 14,
wherein the functional element is a sensor element which outputs an electric signal due to a strain thereof.

16. A physical quantity sensor comprising:
the electronic device according to claim 14,
wherein the functional element is a sensor element disposed on one surface side of the diaphragm.

17. A pressure sensor comprising the electronic device according to claim 1.

18. An altimeter comprising the electronic device according to claim 1.

19. An electronic apparatus comprising the electronic device according to claim 1.

20. A moving object comprising the electronic device according to claim 1.

* * * * *